United States Patent
Siegel

(10) Patent No.: US 9,069,021 B2
(45) Date of Patent: Jun. 30, 2015

(54) APPARATUS AND METHOD FOR MEASURING ELECTRICAL WORK

(76) Inventor: Holger Siegel, Wuppertal (DE)

(*) Notice: Subject to any disclaimer, the term of this patent is extended or adjusted under 35 U.S.C. 154(b) by 0 days.

(21) Appl. No.: 13/805,342

(22) PCT Filed: Jun. 21, 2011

(86) PCT No.: PCT/EP2011/003061
§ 371 (c)(1),
(2), (4) Date: Dec. 19, 2012

(87) PCT Pub. No.: WO2011/160815
PCT Pub. Date: Dec. 29, 2011

(65) Prior Publication Data
US 2013/0110427 A1    May 2, 2013

(30) Foreign Application Priority Data

Jun. 22, 2010 (EP) .................................. 10006459

(51) Int. Cl.
G01R 21/00 (2006.01)
G01R 21/133 (2006.01)
G01D 4/00 (2006.01)

(52) U.S. Cl.
CPC .............. G01R 21/133 (2013.01); G01D 4/004 (2013.01); *Y02B 90/242* (2013.01); *Y04S 20/322* (2013.01)

(58) Field of Classification Search
CPC .......................... G01R 21/133; G01R 21/1333
USPC .......................................................... 702/62
See application file for complete search history.

(56) References Cited

U.S. PATENT DOCUMENTS

| | | | |
|---|---|---|---|
| 6,792,323 B2 * | 9/2004 | Krzyzanowski et al. | 700/90 |
| 6,934,841 B2 * | 8/2005 | Boyles et al. | 713/159 |
| 7,275,000 B2 * | 9/2007 | Howell et al. | 702/62 |
| 7,334,735 B1 * | 2/2008 | Antebi et al. | 235/492 |
| 2005/0060107 A1 * | 3/2005 | Rodenberg et al. | 702/62 |
| 2006/0031180 A1 * | 2/2006 | Tamarkin et al. | 705/412 |
| 2008/0006704 A1 * | 1/2008 | Kim | 235/492 |
| 2008/0150750 A1 | 6/2008 | Parris et al. | |
| 2009/0012917 A1 * | 1/2009 | Thompson et al. | 705/412 |
| 2009/0236416 A1 * | 9/2009 | Morita | 235/380 |
| 2010/0026517 A1 | 2/2010 | Cumeralto et al. | |
| 2010/0070217 A1 * | 3/2010 | Shimada et al. | 702/62 |
| 2010/0176967 A1 | 7/2010 | Cumeralto et al. | |
| 2010/0198423 A1 | 8/2010 | Hirst | |

FOREIGN PATENT DOCUMENTS

| | | |
|---|---|---|
| GB | 2 442 760 A | 4/2008 |
| WO | WO 2006/017671 A1 | 2/2006 |
| WO | WO 2008/086213 A1 | 7/2008 |

* cited by examiner

Primary Examiner — Janet Suglo
Assistant Examiner — Yaritza H Perez Bermudez
(74) Attorney, Agent, or Firm — Norman B. Thot

(57) ABSTRACT

A device for measuring electrical work includes at least one switchable output configured to connect the device to at least one electrical load. An Internet connection means is configured to establish an Internet connection for the device. A clock is configured to electronically determine a current time for the device. At least one electronic memory is configured to store electronic data. A smartcard comprises an integrated microcontroller. The integrated microcontroller is configured to intelligently control the at least one electronic memory, the Internet connection means, the at least one switchable output, the clock, and the electronic data stored in the at least one electronic memory. A smartcard insertion means is configured to have the smartcard be inserted therein. The electronic data from the at least one electronic memory is transmittable via the Internet connection.

15 Claims, 2 Drawing Sheets

APPARATUS AND METHOD FOR MEASURING ELECTRICAL WORK

CROSS REFERENCE TO PRIOR APPLICATIONS

This application is a U.S. National Phase application under 35 U.S.C. §371 of International Application No. PCT/EP2011/003061, filed on Jun. 21, 2011 and which claims benefit to European Patent Application No. 10006459.1, filed on Jun. 22, 2010. The International application was published in German on Dec. 29, 2011 as WO 2011/160815 A1 under PCT Article 21(2).

FIELD

The present invention relates to a device and to a method for measuring electrical work. In most households such a function is performed by a meter which is installed by a corresponding electricity public utility company and is read on a regular basis.

BACKGROUND

The reading of the meter is carried out manually on-site and, on the basis of the data read, the power consumed is then billed to the household.

Many electricity providers also offer reduced rates that often cannot be controlled with a normal meter. These include, for example, minute electricity rates where a reduced rate is activated per minute depending on the load requirement of the public utility company as well as overnight rates, etc.

In order for an electricity provider to prepare a detailed bill, intelligent meters that count the rate currently used as well as the power consumed are required. Such intelligent meters are known as "smart meters" on the market.

In the case of conventional "smart meters", the currently available rate offered by the electricity company is transmitted to the "smart meter" by means of an interface. Depending on the configuration, the "smart meter" then switches on or off one or several outputs to the consumer load at the current electricity rate.

The above-mentioned mode of operation of conventional "smart meters" has a number of disadvantages. The switching of some terminals is not without its complications. Many devices are dimensioned for operation without interruption, with the result that frequent switching on and off can lead to a fault or malfunction. A feed-in with a particular electricity from a particular rate can, therefore, only be inadequately performed.

Since conventional meters and "smart meters" are installed in the household by the electricity provider and the consumer loads are switched on and off via the information from the current electricity rate, the question arises as to whether the electricity provider even has the right to control devices in a household. Since the end customer is not the actual owner of the "smart meter", it is thus unclear who owns the control rights to the end user's terminals.

Where the electricity provider has the possibility to control the terminals directly, the additional difficulty of technical implementation arises, as the control of each terminal belonging to an end customer undoubtedly requires a very high control effort which would be assumed by the electricity provider. This also raises the question of secure communication between the electricity provider and the "smart meter". A sizeable risk exists that an unauthorized person may gain access to communication with the "smart meter" so as to switch terminals on or off.

WO 2006/017671 describes a smart meter system with the above-mentioned disadvantages. In said system, the connected consumer loads are connected by the electricity provider via the Internet. The difficulty of secure communication therefore arises coupled with the risk that an authorized person may gain access to the communication and the smart meter. By the same token, in the case of difficult devices, the user of the terminals cannot independently determine whether or not a device is to be switched on or off by means of rate adjustment. This solution also raises the issue of whether the public utility company is even allowed to own control rights over the end user.

SUMMARY

An aspect of the present invention is to provide a smart method by means of a device for measuring electrical work, which individually defines for each connected terminal when the terminal is to be switched on or off, where the end customer ultimately has the control rights, and where there are no safety risks due to switching commands being issued by the electricity provider. An additional aspect of the present invention is that, by means of the device, to provide as precise a billing as possible of various rates offered by the electricity provider.

In an embodiment, the present invention provides a device for measuring electrical work which includes at least one switchable output configured to connect the device to at least one electrical load. An Internet connection means is configured to establish an Internet connection for the device. A clock is configured to electronically determine a current time for the device. At least one electronic memory is configured to store electronic data. A smartcard comprises an integrated microcontroller. The integrated microcontroller is configured to intelligently control the at least one electronic memory, the Internet connection means, the at least one switchable output, the clock, and the electronic data stored in the at least one electronic memory. A smartcard insertion means is configured to have the smartcard be inserted therein. The electronic data from the at least one electronic memory is transmittable via the Internet connection. In contrast to conventional "smart meters", the device of the present invention is installed by the end customer himself/herself since the device is provided with a plug for connecting the device to a socket. In this respect, various embodiments are intended for various types of socket, for example, an embodiment for a conventional alternating current socket as well as an embodiment for an alternating current socket.

BRIEF DESCRIPTION OF THE DRAWINGS

The present invention is described in greater detail below on the basis of embodiments and of the drawings in which.

DETAILED DESCRIPTION

Figure 1:
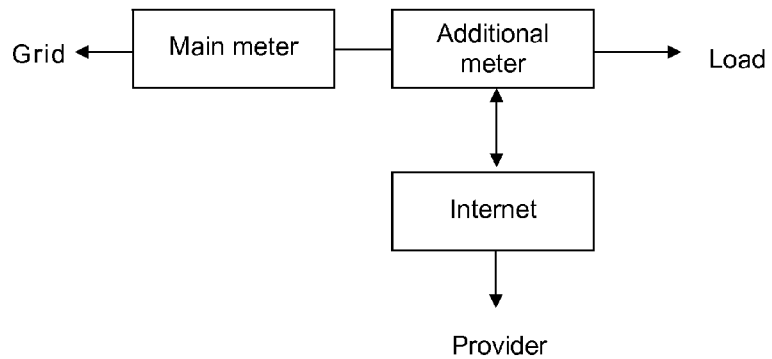
FIG. 1 shows a block diagram for inserting the device according to the present invention into the power grid.

In an embodiment of the present invention, at least one load is connected to the device by means of at least one switchable output whose electrical power consumption is to be counted by means of the device.

The device itself has at least one connection possibility to the Internet which is used to receive data from the electricity provider on the rate currently used. The possible rates can be laid down in a contract between the end customer and the electricity provider.

In an embodiment of the present invention, the device also provides for a clock which is used electronically by the device to identify the current time. This clock can be set manually by means of the connection possibilities to the Internet or be automatically set by means of a time signal from the Internet. The electrical work (energy) of the consumer load is determined by the combination of the power consumption of the connected electrical load and the time which can be read from the clock.

In an embodiment of the present invention, an electronic memory is provided in the device in which data can be stored electronically, particularly the data from the Internet such as rate information, time, the consumer load's switching operations and its power consumption overall and at the pertinent rate. The smart control of the above-mentioned electronic features is assumed by a micro-controller which is integrated in the device or provided on a "smart card" which can be integrated in the device.

In an embodiment of the present invention, the data stored in the device may be transferred and analyzed via the Internet connection. An embodiment of the present invention also allows the stored values to be read and analyzed by means of a display on the device itself, and the data of an "electrical" main meter to be recorded and transferred.

In an embodiment of the present invention, at least a switch or a button is provided by means of which the switching behavior of the switchable output to the consumer load can be set. This switch or button provides that the end customer can determine from the device itself whether the consumer load is to be switched on only at a selected rate, or whether it will be switched on permanently or not switched on at all. In that regard, the end customer himself ultimately has the control rights over his devices and can, by means of the switch or button, make the switching of the consumer load dependent on an available rate.

In an embodiment of the present invention, a wired grid connection and/or a WLAN connection included in the device and/or a mobile radio connection and/or a so-called powerline connection can be used for connecting the device to the Internet where the data is modulated to the voltage curve of the normal power grid. Due to the various connection possibilities of the device to the Internet, a smooth and uncomplicated connection is provided.

For the method of the present invention to measure electrical work (energy) and the precise-rate billing of the power consumed, the above-mentioned device is connected to the socket by the end customer himself and at least one electrical load connected to the device. The device itself always knows the current rate available from the electricity provider. This rate information can be provided to the device in two ways.

The current rate can firstly be retrieved from the public utility company via the connection possibility to the Internet. One or multiple rate times can secondly be stored in the device. The device then knows by means of the clock installed in the device the rate available and at what time. The stored rate times allow the device to connect the consumer load even if the current rate information is not currently available via the Internet connection. The stored rate times can be stored in the device by means of the connection possibility to the Internet, particularly by the electricity provider.

Depending on the rate available, the consumer load is then switched on or off. In an embodiment of the present invention, at least a switch or a button is provided by means of which the end customer can determine whether the consumer load which is connected to the device is to be switched on only at an available selected rate, or whether it will be switched on permanently or switched off, or should remain switched on for a specific period.

The information provided to the device is stored and archived via the electronic memory included in the device, in particular, the rate information, the time, the users' current consumption and the switching operations.

Where the electricity provider issues a bill, precise time and rate billing for the consumer load(s) connected to the device can now be prepared using the information stored in the memory. Since the actual billing continues to take place via the still-existing conventional meter in the household, the end customer is provided with vouchers based on the information for the times stored in the device for the times at which the consumer load connected to the device was operated at a reduced rate. These vouchers may be paid out in agreement with the electricity provider or be set off against the next bill.

Since the control rights, as described above, are ultimately allocable to the end customer, the end customer may independently determine how and the circumstances under which a consumer load can or should be connected. The number of devices used in a household according to the present invention is likewise not limited, as it is not necessary for the public utility company to control said devices at all times. The safeguarding of the connection to the Internet is also of secondary importance for connecting the consumer loads, as no switching orders whatsoever may be issued to the device. Consequently, no unauthorized persons can connect the connected consumer loads.

In an embodiment of the present invention, an additional control option can be provided in the device. This control option is designed to prevent several devices according to the present invention from being series-connected, so that the electricity provider has to prepare multiple vouchers for the same user.

A possible control possibility for the device according to the present invention is an additional signal applied to the mains voltage which "marks" a consumer load's power. A device according to the present invention here has a receiver for analyzing the mark, a transmitter to apply the marking and optionally a line filter in order not to disturb the mains voltage as other signals may already be modulated to the mains voltage. The marking of the power for a consumer load is determined from a demand measurement which the device according to the present invention performs. Where an additional second device according to the present invention is series-connected to a first device according to the present invention, the marking of a consumer load is read by means of the receiver. If this reveals that the consumer load's power has already been measured, as the power is "marked", no other recording of the relevant consumer load is performed and/or the output to the relevant consumer load is not switched on or off.

As an alternative to the above-mentioned marking of consumer load power, the control possibility can also be carried out by means of a wired control cable and/or by means of a radio signal.

In an embodiment of the present invention, in the event of a switching-on sequence of the device, a temporary load profile of the time and power consumption of the relevant user is stored in the electronic memory of the device. At the time of billing via the electricity provider, switching operations which occur simultaneously can then be compared by means of the load profiles and only billed once as a credit for the same load profile.

The above-mentioned method requires that corresponding rates, such as minute electricity or off-peak electricity, are requested by the end customer from the respective electricity provider, and that the devices according to the present invention are registered with the electricity provider.

In the case of the above-mentioned embodiment of the device according to the present invention with buttons or switches, the end customer can set whether a particular rate exclusively causes the end-use customer to connect, the rate is only recorded, the consumer load remains switched on for the remaining period nonetheless, the consumer load is generally switched on, or whether the consumer load is generally switched off. Similarly, it can be set that no switching operation is to be carried out under one of the above-mentioned conditions, but at least one warning signal should appear in the device according to the present invention. This warning signal can be shown on the above-mentioned optional display or with suitable optical or acoustic means.

The device according to the present invention as well as the transmission of data may be configured by the public utility company. However, it can also be configured by the end customer himself. The configuration also includes the definition and function of individual rates for the various buttons or switch settings of the above-mentioned embodiment with buttons or switches.

The data is read by the end customer or the electricity provider by means of the above-mentioned connection possibilities, or also by means of an optional interface that is included in the device. This can be a conventional serial interface or even an interface to any BUS system.

The control of the above-mentioned device as well as the analysis of the information provided to the device are performed by means of a micro-controller. This micro-controller is fed to the device externally. The micro-controller is integrated onto a smart card which can be inserted in the device. The above-mentioned functions as well as the method for such are only carried out if the smart card is inserted into the device.

Further advantages of the present invention are derived from the drawings below and the corresponding description.

FIG. 1 shows the device according to the present invention as an additional meter to the commercially-available electricity meter (referred to as main meter in FIG. 1). The main meter furthermore acts as the principal billing-relevant electricity meter, the device according to the present invention being connected as the additional meter behind the main meter. The additional meter can be connected to any socket at any power grid location.

The consumer load to be operated will then be connected to the additional meter, the additional meter thus arranged between the socket and the consumer load. Each current will thus flow to the consumer load not just via the main meter as before, but also via the device according to the present invention, namely the additional meter. By means of a connection possibility to the Internet, the device according to the present invention has a connection to the electricity provider by means of which the device according to the present invention can retrieve the current available rates from the electricity provider.

Depending on the available electricity rate, the device according to the present invention can then switch the consumer load on or off. A switch or button is furthermore included in an embodiment of the present invention by means of which the switching behavior of the device according to the present invention can be set. One can here in particular decide whether the consumer load is not to be switched on continuously, will be switched on only at particular available rates, or will be switched on continuously.

The device according to the present invention (here the additional meter) stores the above-mentioned information in its electronic memory, which is then available for retrieval, be it via the connection possibility to the Internet or an interface physically existing at the additional meter. A display is provided for the device according to the present invention in a special illustrative embodiment by means of which the stored information is also retrievable.

Figure 2:
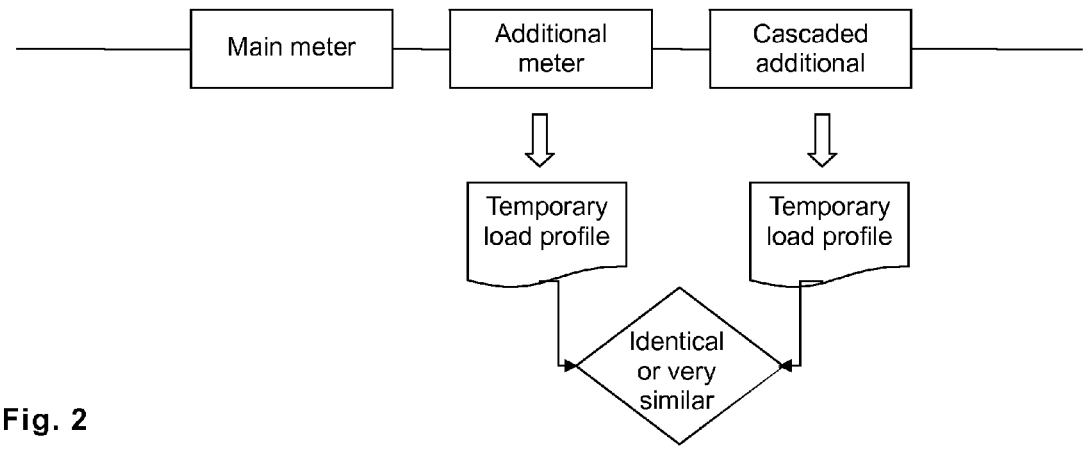
FIG. 2 shows a block diagram of an embodiment of two devices according to the present invention which are series-connected to a consumer load and prevent double counting of the power consumer by the user due to the creation of temporary load profiles.

FIG. 2 shows the above-mentioned security function for preventing double metering. Since it is possible to insert several devices according to the present invention as additional meters between the main meter and the consumer load, safety measures must be taken so that the power to the consumer load is only counted once. In that connection, each device according to the present invention generates a temporary load profile of the time and the power consumption when switching on the downstream consumer load and stores said temporary load profile in the electronic memory of the device according to the present invention. At the time of billing by the electricity provider and the issuing of any vouchers, as described above, double meterings can now be ruled out in that load profiles and their switching times are extremely similar and are only analyzed once at the same switching time.

Figure 3:
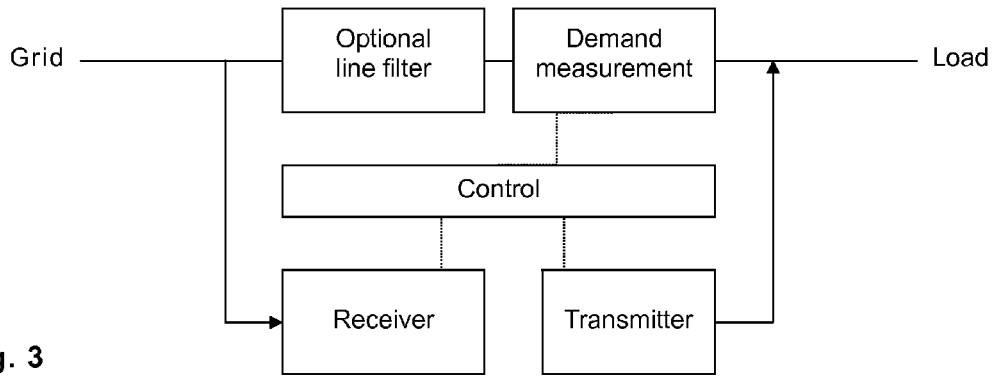
FIG. 3 shows a block diagram of a device according to the present invention which "marks" the power already counted by means of an additional control possibility.
Figure 4:
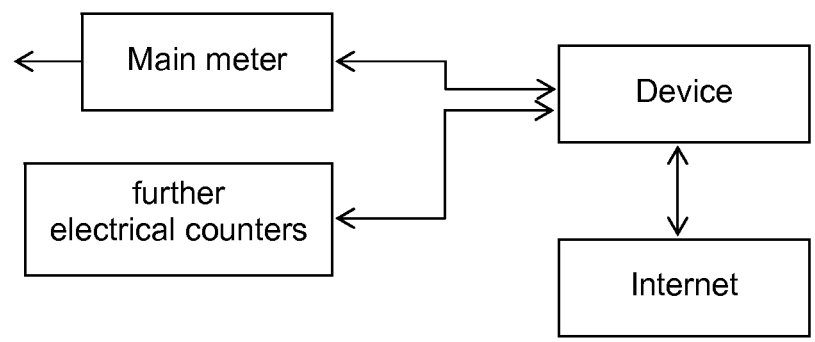
FIG. 4 shows a block diagram of a device according to the present invention with further electrical counters.

FIG. 3 shows an additional control of the device according to the present invention for the same safety measure as FIG. 2. Here the device according to the present invention also consists of a receiver and a transmitter, the transmitter providing that an information message is modulated to the voltage signal which is guided to the downstream consumer load in order to "mark" the power to the consumer load as already counted. The receiver reads such a modulated signal from the mains voltage and notifies the device according to the present invention by electronic means that this power has already been counted. As a result, this device according to the present invention will not perform the switching operation or not calculate the times for a reduced rate.

Since the voltage signal was considerably disrupted when using many of the above-mentioned devices according to the present invention according to the last-mentioned method, an optional line filter is included in the device in order to filter the modulated signal and not return malfunctions to the general power grid.

A marking of the power can occur not just by means of modulation of information to the power grid voltage, but also by means of a wired connection between two devices according to the present invention or a radio signal.

The present invention is not limited to the illustrative embodiments of this description and other features are in fact also imaginable. The connection possibility to the Internet is, for example, not just achievable by means of the above-mentioned facilities, but also by means of a Bluetooth connection, GSM, UMTS, etc. Reference should also be had to the appended claims.

What is claimed is:

1. A device for measuring electrical work, the device comprising:
   at least one switchable output configured to connect the device to at least one electrical load;
   an Internet connection means configured to establish an Internet connection for the device;
   a clock configured to electronically determine a current time for the device;
   at least one electronic memory configured to store electronic data;
   a smartcard comprising an integrated microcontroller, the integrated microcontroller being configured to intelligently control the at least one electronic memory, the Internet connection means, the at least one switchable output, the clock, and the electronic data stored in the at least one electronic memory;
   a smartcard insertion means configured to have the smartcard be inserted therein; and
   at least one of a display, an optical alarm device, and an acoustic alarm device,
   wherein,
   the electronic data from the at least one electronic memory is transmittable via the Internet connection, and
   the device is used for a process for measuring electrical work of at least one electrical load, the process comprising:
      providing the device;
      connecting the device to a socket;
      connecting the at least one electrical load to the device via the at least one switchable output;
      connecting the device to the Internet via the Internet connection means;
      transmitting a current rate information from an electricity supplier to the device via the Internet connecting device;
      switching an electrical load on or off via the at least one switchable output;
      storing information comprising at least one of the current rate information, a time, a current consumption, and a switching operation in the at least one electronic memory;
      retrieving the information via the Internet connection or via the display;
      preparing a voucher by an electricity supplier using the information stored in the at least one electronic memory based on a power consumed by the device and a relevant rate; and either,
      preparing the voucher by the electricity supplier in a billing period for a user only if two devices with a same load profile were not connected during a same circuit time; or
      wherein, the device further comprises a control possibility configured to feed additional information to the device; and
      identifying a connected current via the control possibility so that an additional device connected downstream of the device cannot again connect to and/or again count an identified current.

2. The device as recited in claim 1, wherein the electronic data includes at least one of data from the Internet, a time, a switching procedure, and a current consumption of the at least one electrical load.

3. The device as recited in claim 1, further comprising at least one plug configured to connect the device to a socket.

4. The device as recited in claim 1, further comprising at least one switch or key button configured to set a switch behavior of the at least one switchable output.

5. The device as recited in claim 1, further comprising at least one of a display, an optical alarm device and an acoustic alarm device.

6. The device as recited in claim 1, wherein the Internet connection means configured to establish an Internet connection for the device comprises at least one of a wired network connection, a WLAN connection, a mobile phone connection, and a power line connection.

7. The device as recited in claim 1, wherein the clock is set by an Internet connection time signal.

8. The device as recited in claim 1, further comprising a control possibility configured to feed additional information to the device.

9. The device as recited in claim 8, wherein the control possibility is provided via at least one of a signal applied to a mains voltage, at least one cable-linked control line, and a radio signal.

10. A process for measuring electrical work of at least one electrical load, the process comprising:
   providing a device for measuring electrical work, the device comprising:
      at least one switchable output configured to connect the device to the at least one electrical load,
      an Internet connection means configured to establish an Internet connection for the device,
      a clock configured to electronically determine a current time for the device,
      at least one electronic memory configured to store electronic data,
      a smartcard comprising an integrated microcontroller, the integrated microcontroller being configured to intelligently control the at least one electronic memory, the Internet connection means, the at least one switchable output, the clock, and the electronic data stored in the at least one electronic memory,
      a smartcard insertion means configured to have the smartcard be inserted therein, and
      at least one of a display, an optical alarm device and an acoustic alarm device,
      wherein, the electronic data from the at least one electronic memory is transmittable via the Internet connection;
   connecting the device to a socket;
   connecting the at least one electrical load to the device via the at least one switchable output;
   connecting the device to the Internet via the Internet connection means;
   transmitting a current rate information from an electricity supplier to the device via the Internet connecting device;
   switching an electrical load on or off via the at least one switchable output;
   storing information comprising at least one of the current rate information, a time, a current consumption, and a switching operation in the at least one electronic memory;
   retrieving the information via the Internet connection or via the display;
   preparing a voucher by an electricity supplier using the information stored in the at least one electronic memory based on a power consumed by the device and a relevant rate; and either, preparing the voucher by the electricity supplier in a billing period for a user only if two devices with a same load profile were not connected during a same circuit time; or wherein, the device further comprises a control possibility configured to feed additional information to the device; and identifying a connected current via the control possibility so that an additional device connected downstream of the device cannot again connect to and/or again count an identified current.

11. The process as recited in claim 10, wherein, the device further comprises:
   at least one switch or key button means configured to set a switch behavior of the at least one switchable output; and the process further comprises:
   setting a defined function of the device via the at least one switch or key button, and
   switching the at least one electrical load on or off via a combination of the switch or key button with the current rate information.

12. The process as recited in claim 10, further comprising:
   storing a fixed rate information in the at least one electronic memory via the internet connection means; and
   switching the at least one switchable output based on the fixed rate information stored by the at least one electronic memory.

13. The process as recited in claim 10, wherein, upon a performance of a switch-on operating sequence by a user, the process further comprises:
   generating a temporary load profile; and
   storing the temporary load profile in the at least one electronic memory.

14. The process as recited in claim 10, wherein, the smartcard is integrated directly into the device, and the smartcard is configured to assume control of the device and of the switching operation.

15. The process as recited in claim 10, further comprising, at least one of reading data into and transmitting data to the at least one electronic memory from electrical counters via the internet connection means.

* * * * *